Aug. 12, 1969 N. S. EHRENBERG 3,460,241
METHOD OF COUNTING SEMICONDUCTOR DEVICES
ON THICK FILM CIRCUITS
Filed June 21, 1967

INVENTOR.
NATHAN S. EHRENBERG
BY James M. Nickels
ATTORNEY

United States Patent Office 3,460,241

Patented Aug. 12, 1969

3,460,241

METHOD OF COUNTING SEMICONDUCTOR DEVICES ON THICK FILM CIRCUITS

Nathan S. Ehrenberg, Oakhurst, N.J., assignor to The Bendix Corporation, a corporation of Delaware Filed June 21, 1967, Ser. No. 647,742
Int. Cl. B01j *17/00;* B23k *31/02*
U.S. Cl. 29—590 2 Claims

ABSTRACT OF THE DISCLOSURE

A method of mounting silicon semiconductor elements on a thick film circuit utilizing a mixture of platinum and gold to form a gold silicon eutectic bond.

BACKGROUND OF THE INVENTION

Field of the invention

The present invention pertains to micro circuits in which active semiconductor devices are mounted on ceramic substrates carrying thick film circuits.

Description of the prior art

In the past it has been the practice to first apply and fire a platinum gold paste on the ceramic substrate. Then in order to form a gold silicon eutectic with the silicon semiconductor device, it was necessary to provide more gold by either applying a second layer of gold paste over the platinum gold and refiring, using a gold preform, or evaporating a layer of gold on the back of the semiconductor device. This required extra handling and increased the cost of the device. The present invention mixes additional gold paste to the platinum gold paste before applying to the ceramic and firing. This provides sufficient gold to form a good gold silicon eutectic bond with the semiconductor device.

SUMMARY

The invention relates to the mounting of semiconductor devices on substrates to form micro-electronic circuits. It provides an improved method of making a gold silicon eutectic bond with the semiconductor device.

DESCRIPTION OF THE PREFERRED EMBODIMENT

Figure 1:
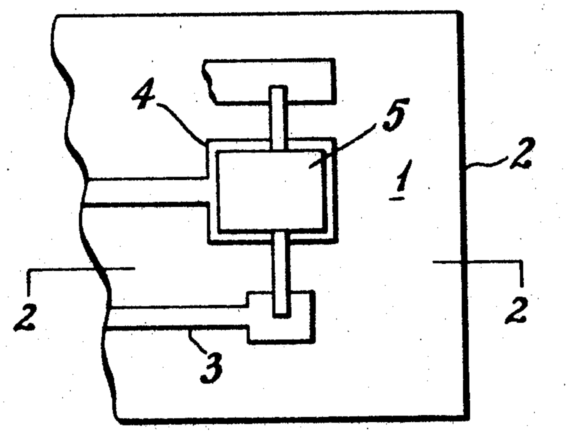
FIGURE 1 is a diagrammatical plan view of a portion of a thick film circuit embodying the invention.
Figure 2:
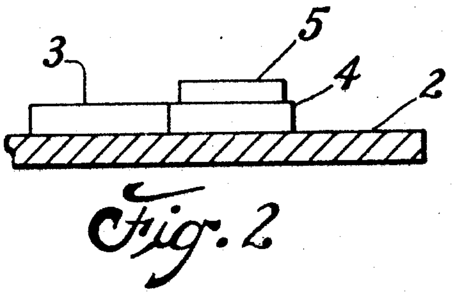
FIGURE 2 is a sectional view of the device of FIGURE 1 taken along the lines 2—2.

Referring now to the drawing, a thick film circuit is indicated generally by the numeral 1. Only a portion of the circuit 1 is illustrated, however, it is understood that it could be any number of circuits. The circuit 1 includes a ceramic substrate 2 upon which a thick film circuit 3 is applied.

The thick film circuit 3 is formed by applying a mixture of platinum gold paste and gold paste, blended in equal parts, in a predetermined pattern on the substrate 2. The platinum gold paste comprises 75% metal and 25% binder with the platinum and gold content being substantially equal. The gold paste comprises 75% metal and 25% binder. By combining the platinum gold paste and the gold paste in equal amounts a platinum gold ratio of 1 to 3 is provided.

The circuit 3 includes a mounting pad 4 for mounting a transistor 5. The transistor 5 may be one of the silicon planar types processed in a conventional manner. The transistor 5 is positioned on the pad 4 then heat and vibration are applied in a conventional manner to form a gold silicon eutectic bond between the pad 4 and the transistor 5.

Although only one embodiment of the invention has been illustrated and described, various changes in the form and relative arrangement of the parts, which will now appear to those skilled in the art, may be made without departing from the scope of the invention.

What is claimed is:

1. A method of forming a thick film circuit comprising applying a mixture of platinum gold paste and gold paste in a predetermined pattern on a ceramic substrate, in which said platinum gold paste is essentially 75% metal and 25% binder with the platinum and gold content being substantially equal, and said gold paste is essentially 75% metal and 25% binder, and firing to form a bond between said substrate and said paste.

2. The method as set forth in claim 1 and including positioning a silicon semiconductor device on said circuit and heating to form a gold silicon eutectic bond between said semiconductor device and said circuit.

References Cited

UNITED STATES PATENTS

| | | | |
|---|---|---|---|
| 2,964,839 | 12/1960 | Marafioti et al. | 29—472.9 X |
| 3,316,628 | 2/1967 | Lang | 29—472.7 |
| 3,238,062 | 1/1966 | Sunners et al. | 117—212 X |
| 3,292,240 | 12/1966 | McNutt et al. | 29—577 |

JOHN F. CAMPBELL, Primary Examiner

R. W. CHURCH, Assistant Examiner

U.S. Cl. X.R.

29—473, 626; 117—217